United States Patent [19]
Hashimoto et al.

[11] Patent Number: 5,917,839
[45] Date of Patent: Jun. 29, 1999

[54] APPARATUS AND METHOD FOR A READ-MODIFY-WRITE OPERATION IN A DYNAMIC RANDOM ACCESS MEMORY

[75] Inventors: Masashi Hashimoto, Richardson, Tex.; Anjana Ghosh, Bangalore, India

[73] Assignee: Texas Instruments Incoporated, Dallas, Tex.

[21] Appl. No.: 08/863,851

[22] Filed: May 27, 1997

Related U.S. Application Data

[60] Provisional application No. 60/018,963, Jun. 7, 1996.

[51] Int. Cl.$^6$ .............................. G06F 11/10; H03M 13/00
[52] U.S. Cl. ............................ 371/51.1; 371/48; 371/21.1
[58] Field of Search ............................. 371/51.1, 48, 21.1

[56] References Cited

U.S. PATENT DOCUMENTS 5,274,788 12/1993 Koike ....................................... 395/425

*Primary Examiner*—Phung M. Chung
*Attorney, Agent, or Firm*—Robby T. Holland; Carlton H. Hoel; Richard L. Donaldson

[57] ABSTRACT

In a dynamic random access memory unit 10, a circuit, $61_0$–$61_{N-1}$, 615, and 617, is provided in which a non-change of each address signal of an address signal group during a next consecutive clock cycle blocks the application of the read activation control signal to the memory unit 10. In this manner, the memory unit 10 is inactive (i.e., does not perform a read operation) during the modify portion of a read-modify-write operation so that potential conflicts in the operation of the memory unit 10 are avoided.

14 Claims, 3 Drawing Sheets

APPARATUS AND METHOD FOR A READ-MODIFY-WRITE OPERATION IN A DYNAMIC RANDOM ACCESS MEMORY

This application claims priority under 35 USC § 119(e)(1) of provisional appliation No. 60/018,963, filed Jun. 7, 1996.

BACKGROUND OF THE INVENTION

1. Field of the Invention

This invention relates generally to integrated semiconductor circuits and, more particularly, to dynamic random access semiconductor memories. In the read-modify-write operation of a memory unit, a group of data signals is retrieved (or read) from the storage cells of the memory, transferred to a central processing unit for modification, and stored (written) in the same group of storage cells from which they were retrieved.

2. Description of the Related Art

The read-modified-write operation is a time critical operation, particularly in a data processing system in which the operation of the memory unit is synchronized with the operation of the central processing unit. In addition, when the memory unit is operating in a "page" mode, i.e., wherein groups of data signals are retrieved from storage cells in consecutive clock cycles, the timing margins for the operation are even smaller.

Referring to FIG. 1 and FIG. 2, the apparatus and timing diagram for a read operation is shown. The memory unit 10 has address signals, control signals, and a (synchronous) clock (SCLK) signal applied thereto. A group of address and control signals from the central processing unit 5 are applied to the control unit 19 of the memory unit 10. In response, a group of storage cells in the data bit storage array 11 are addressed and the signals retrieved, in response to a read activation control signal, from the storage cells are applied to a data out terminal of the memory unit 10 and to the a parity bit generating unit. Simultaneously with the retrieval of the data bits, a parity signal is retrieved from the parity bit storage unit 12 and applied to the parity bit generating unit 13. In the parity bit generating unit 13, the data bit generated by unit 11 is compared with the retrieved parity signal to determine whether and error has been introduced in the stored data signals. The retrieved data signals are then transferred to the central processing unit along with a parity signal indicating whether the retrieved data is valid. Referring to FIG. 2, the timing diagram showing the relation of the retrieved data signals relative to the SCLK signal, the SCLK signal being the signal which initiates the read cycle. FIG. 2 illustrates that valid data is not available until the middle of the read cycle, the delay being the result of the accessing of the signal storage locations and the associated circuit operation.

Referring to FIG. 3 and FIG. 4, a apparatus and a timing diagram of the typical write operation is summarized. The data in, control signals, and address signals from the central processing unit are applied to the memory unit 10. Within the memory unit 10, the address and control signals from the central processing unit 5 are applied to the control unit 19. Control unit 19 processes these signals distributes the resulting address and control signals in an appropriate manner throughout the memory unit 5. The data in signals are applied to the data bit storage unit 11, in response to a write activation, for storage therein and are applied to the parity generating unit 13. The parity bit resulting from the operation of the parity bit generating unit 13 is stored in the parity bit storage unit 12 at a location related to the associated data bit group. Referring to FIG. 4, the timing relationship of the write cycle relative to the SCLK signal is shown. Of particular interest is that valid data must be available prior to the initiation of the write cycle in order that the parity bit can be stored simultaneously with the data bits.

Referring to FIG. 5, the timing of the data transfer relative to the SCLK signal is shown for the read-modify-write operation. During the first clock cycle, the data is retrieved from the memory unit 10 and transferred to the central processing unit 5 shown in FIG. 1. The central processing unit 5 modifies the data group and transfers the modified data group to the memory unit 10 before starting the third clock cycle, i.e., the write operation cycle for the memory unit 10. The transfer is the result of the requirement that the input data preparation (data set-up) occur before starting the write operation. The memory unit 10 stores the modified data group at the same address from which the data group was retrieved from the central processing unit 5 during the third clock cycle. However, the parity checking operation of a read operation can not begin until the valid data is retrieved from the data bit storage unit. And during the write operation, the parity generation must begin as soon as possible because the generated parity bit and the data group applied to the memory unit must be stored simultaneously. Therefore, the read-modify-write operation can be a time critical operation in which the to avoid conflict in the memory unit 10.

A need has therefor been felt for apparatus and an associated technique for reducing the possible conflict in the memory unit during a read-modify-write operation.

SUMMARY OF THE INVENTION

The aforementioned and other features are accomplished, according to the present invention, by including apparatus for identifying a non-changing address signal group in the read-modify-write operation during the clock cycle between the read and the write operation. The non-change in the address is used to block the read activation signal and prevent the retrieval of data during the modify cycle of the read-modify-write operation. With the removal of the read signal, the memory unit is available to receive data for the write cycle when the data is available from the central processing unit.

These and other features of the present invention will be understood upon the reading of the Specification in conjunction with the Figures.

DESCRIPTION OF THE PREFERRED EMBODIMENT(S)

1. Detailed Description of the Drawings

FIGS. 1–4 have been described with respect to the prior art.

Figure 1:
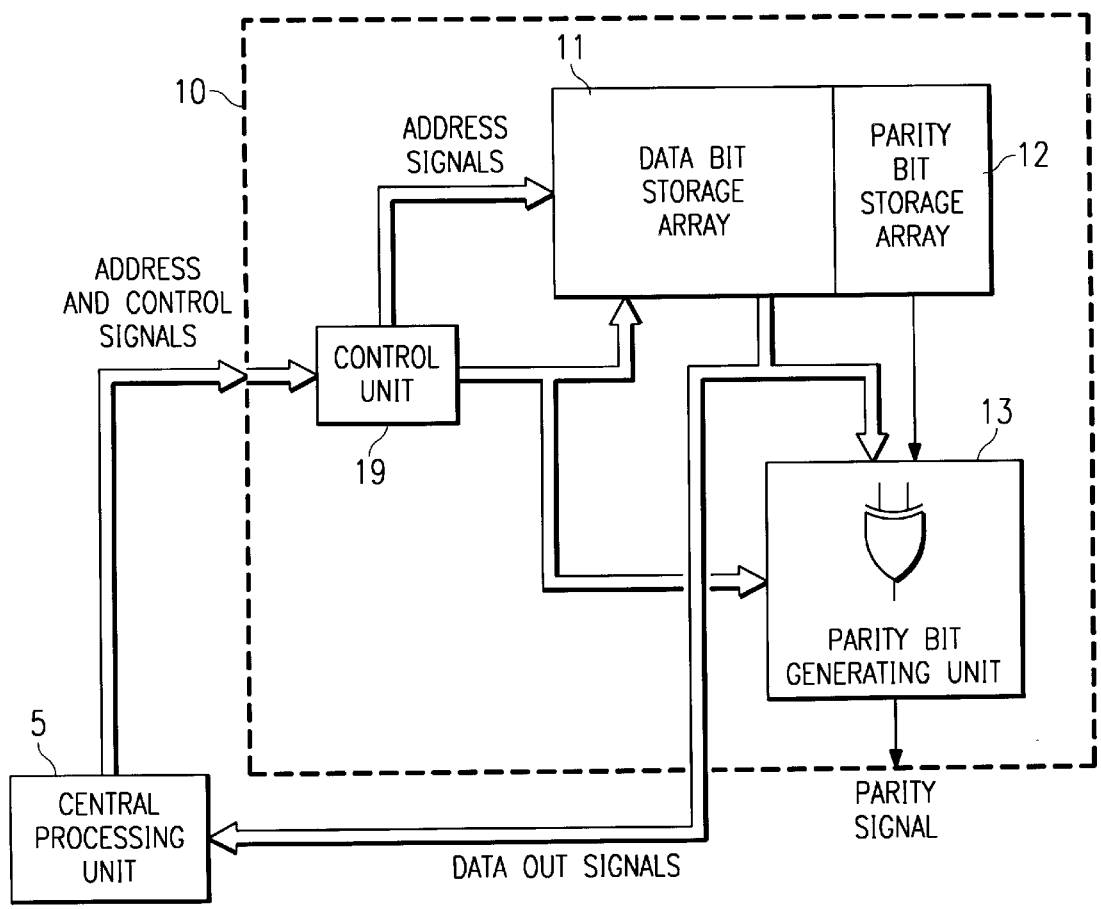
FIG. 1 is a diagram of a memory circuit configuration illustrating a read operation.
Figure 2:
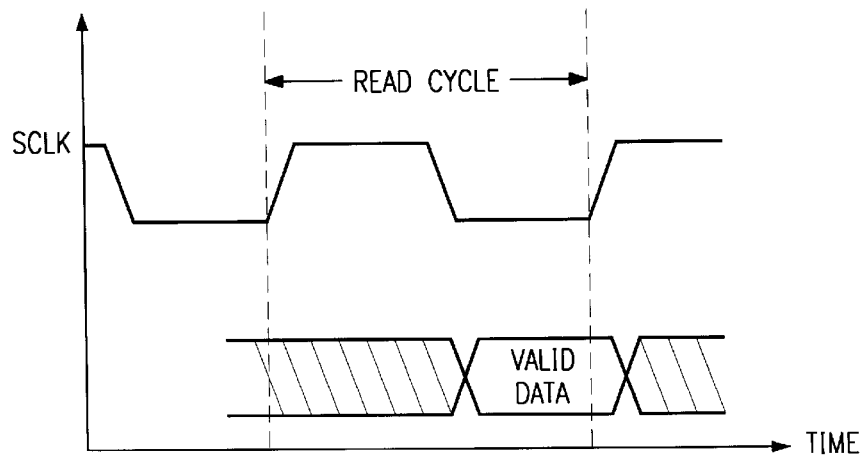
FIG. 2 is a timing diagram showing the relationship between the SCLK (clock) signal and the data signals for the read operation.
Figure 3:
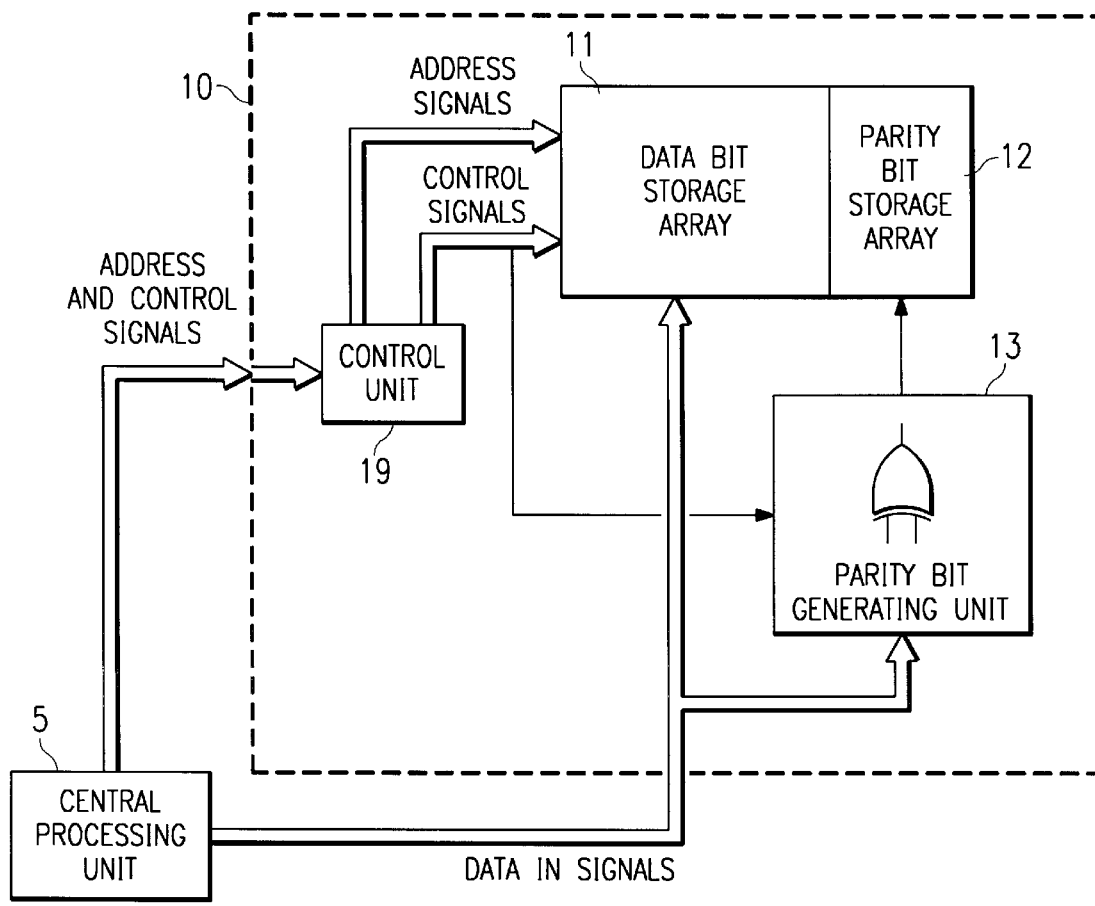
FIG. 3 is a diagram of a memory circuit configuration illustrating a write operation.
Figure 4:
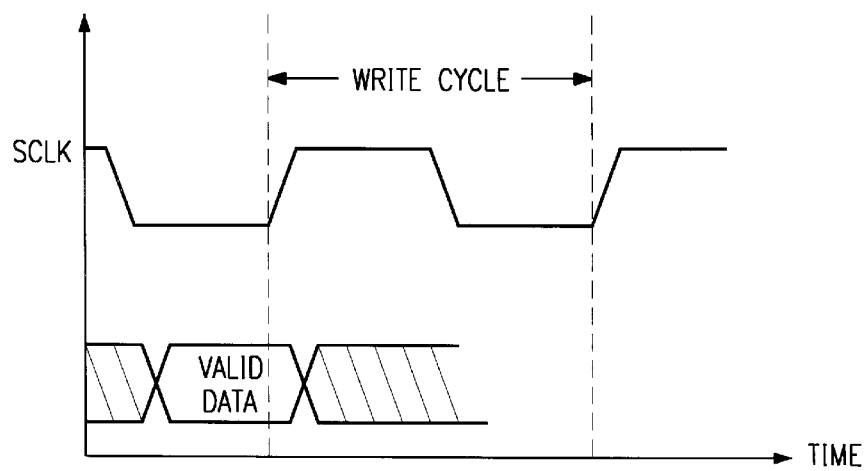
FIG. 4 is a timing diagram showing the relationship between the SCLK (clock) signal and the data signals for the write operation.
Figure 5:
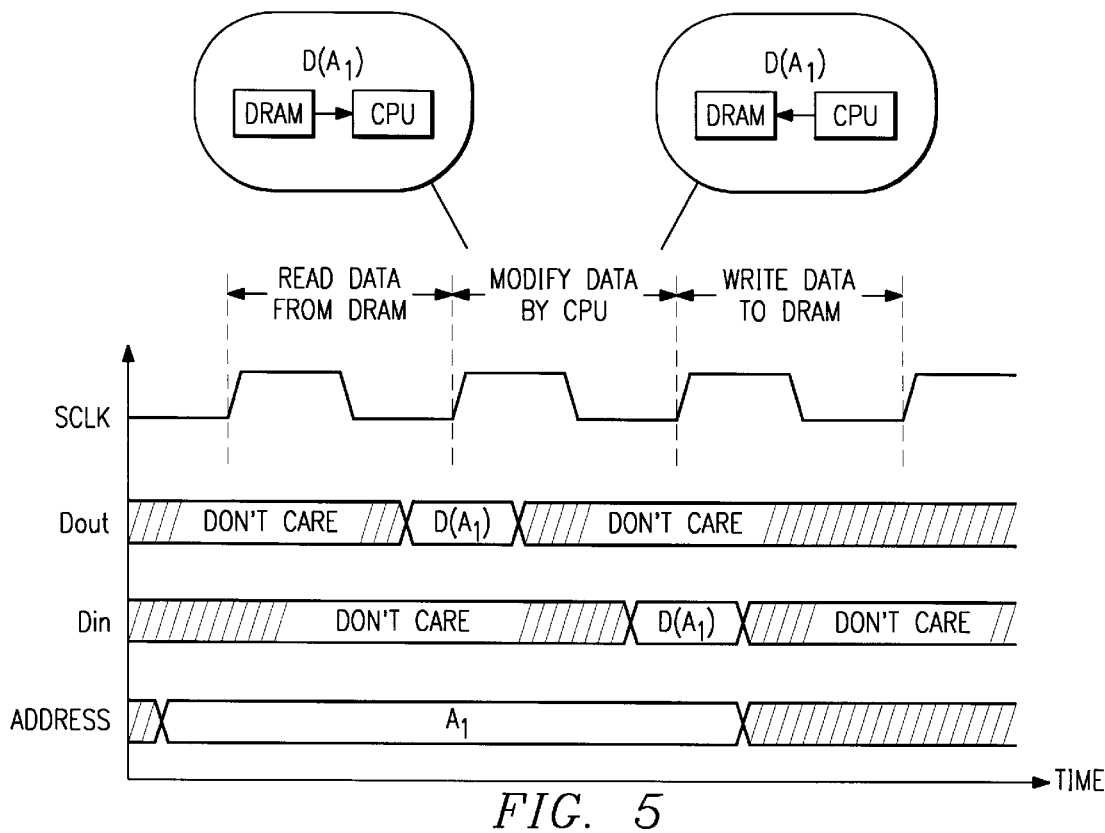
FIG. 5 is a timing diagram showing the transfer of data between the central processing unit and the memory unit.

Referring to FIG. 5., a timing diagram for the read-modify-write operation is shown. During the first SCLK (clock) cycle, the data signals are retrieved from the memory unit 10 and transferred to the central processing unit (CPU) 5. During the second SCLK cycle, the modification is performed on the retrieved data signals by the central processing unit 5 and the modified data signals are applied to the memory unit 10 for the write operation performed in the third SCLK cycle. During the third SCLK cycle, the modified data from the central processing unit is written (stored) into the storage cells of the memory unit 10. During the three consecutive SCLK cycles, the address signals do not change. The read activation control signal results in a read operation being performed in the memory unit 10 on the addressed storage cells in the first clock cycle. The memory unit 10 performs no activity on the addressed storage cells in the second clock cycle. And a write operation is performed on the addressed storage cells during the third clock cycle.

Figure 6:
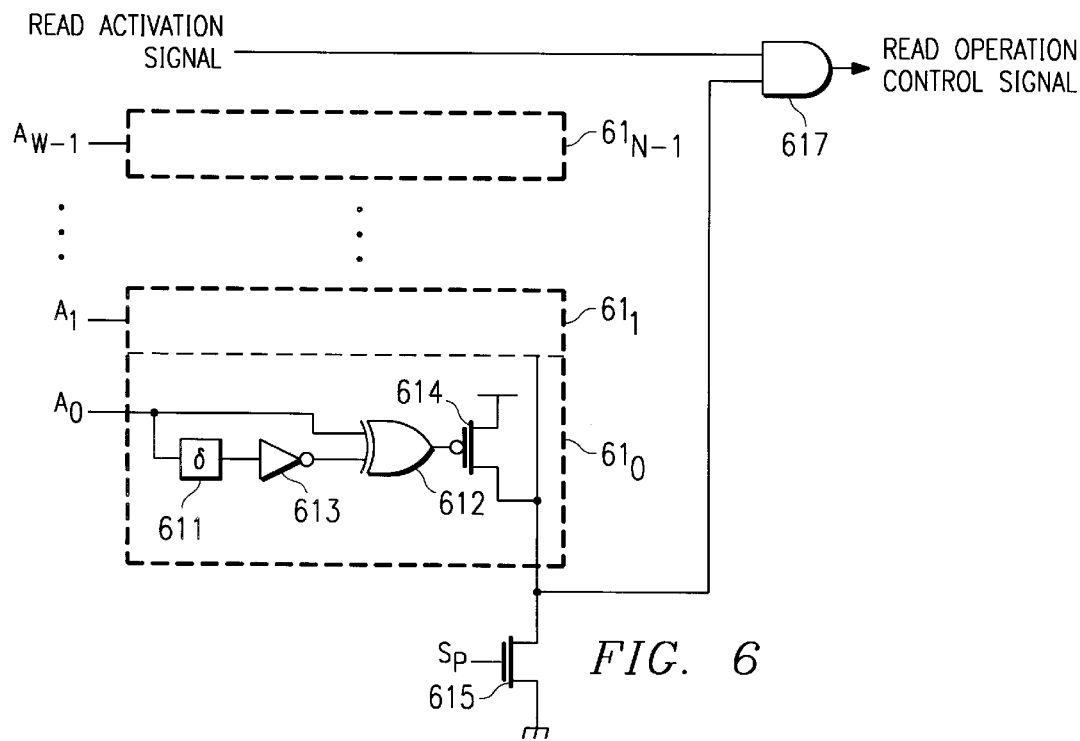
FIG. 6 is a block diagram of a circuit for identifying a change in the address signal group and for generating a control signal.

Referring to FIG. 6, a circuit for detecting the non-changes in the address signal group is shown. A read activation control signal is applied to one terminal of logic AND gate 617. Each ADDRESS signal $A_0-_{N-1}$ is applied to a detection circuit $61_0-61_{N-1}$, respectively. Each detection circuit includes a delay function unit 611, an inverting amplifier 613, a logic exclusive OR gate 612, and a p-channel transistor 614. The address signal applied to the detection circuit is applied to a first terminal of exclusive OR gate 612 and is applied through the delay function unit 611 and the inverting amplifier 613 to a second terminal of exclusive OR gate 612. The output signal of exclusive OR gate 612 is applied to a gate terminal of a p-channel field effect transistor 614. One source-drain terminal of transistor 614 is coupled to a power supply, while a second source-drain terminal of transistor 614 is coupled to a second input terminal of AND gate 617 and to a first source-drain terminal of transistor 615. A second source drain terminal of transistor 615 is coupled to ground potential, while a gate terminal of transistor 615 has the Sp signal applied thereto.

2. Operation of the Preferred Embodiment(s)

The operation of the present invention relates to the fact that, following a read operation and in the absence of a memory access operation, the previous read address will be maintained by the central processing unit or the previous read address signal group will be reissued by the central processing unit. In addition, a read activation control signal will be generated which will cause the retrieval of the same signal group. The present invention recognizes the non-change of the address signal group in conjunction with the (SCLK) clock signal and blocks the transmission of the read activation control signal. As indicated in FIG. 5, the data in a read operation is available into the next SCLK cycle. Similarly, in order to complete the write operation by the end of a clock cycle, the data signal group must be available in the previous clock cycle to permit the generation of a parity bit for the data group. As will be clear, a conflict will occur when write operation follows in the next clock cycle after a read operation. As shown in FIG. 5, three SCLK cycles are required to execute a read-modify-write operation. In the read cycle, (or first SCLK cycle), the (DRAM) memory unit 10 is in the read operation mode. In the write cycle (or third SCLK cycle), the memory unit 10 is in the write operation mode. In the second SCLK cycle, a memory unit 10 access is not required. However, since the (DRAM) memory unit 10 has no "no-operation" modes, a (meaningless dummy) read operation is performed in the second SCLK cycle in a conventional (DRAM) memory unit 10. Of course, a dummy write operation instead of a dummy read operation may be performed in the second SCLK cycle. But memorized data will be destroyed (or replaced by meaning less data) when the write operation is selected as a dummy operation. Therefore, a read dummy operation is preferred. Then, the conflict occurs at the end of the second SCLK cycle. Because the memory unit 10 is in a read mode of operation, data I/O lines are occupied by the data from the data bit storage array 11. On the other hand, to perform a write operation in the third SCLK cycle, input data must be placed on the data I/O lines before the beginning of the third cycle, thereby resulting in a conflict.

Referring once again to FIG. 6, the operation of this circuit can be understood as follows. The second input terminal of AND gate 617 is charged to a logic "0" state by a signal Sp applied to the gate of transistor 615 during the DRAM storage cell precharge cycle. The Sp signal then becomes a logic "0" state at the beginning of the active cycle. When an address bit changes state, the exclusive OR gate 612 of the detection unit 61 to which the changing address bit generates a logic "0" state pulse. The result of this logic "0" state pulse is to cause the second input terminal of AND gate 617 to have a logic "1" state. The read activation control signal, generated by the central processing unit, can therefore pass through logic AND gate 617. When none of the address bits change, the second input terminal of logic AND gate 617 remains in a zero logic state. The read activation control signal is prevented from passing through logic AND gate 617. By latching the previously read data out signals at the data out terminal of the memory unit 10 and by suppressing the read activation control signal, the correct data out signals can be kept. The read operation is suppressed. Data I/O lines are not occupied by the data from the data bit storage array 11. Therefore, input data can be placed on the data I/O lines at any time during the second SCLK cycle. As a result, the parity bit generation can be performed at the same time as the write operation without a resulting conflict in the parity bit generating unit.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A synchronous dynamic random access memory unit having read and write operations initiated by an address signal group, a system clock signal and an activation signal; said memory unit comprising:

a storage cell array for storing data signals; and control apparatus responsive to address signals, a system clock signal, and a read control signal for retrieving data signals from said storage cell array, said control apparatus including a gate circuit responsive to a non-change in said address signals and a system clock signal for preventing said read control signal from initiating a read operation during a modify portion of a read-modify-write operation.

2. The memory unit of claim 1 wherein said memory operates in a page mode of operation.

3. The memory unit of claim 1 further including:

a parity generation and checking unit; and a parity bit storage unit for storing a parity bit with each stored data group.

4. The memory unit of claim 1 wherein said gate circuit has:

a plurality of detection circuits, each detection circuit having an address signal applied thereto, an output signal of a detection circuit changing from a first logic state to a second logic state when an applied address signal changes state;

a combining circuit having output signals from said detection circuits applied thereto, an output signal of said combining circuit changing from a third logic state to a fourth logic state when one of said detection circuit output signals changes from said first logic state to said second logic state; and a gate unit having said combining circuit output signal and a read activation signal applied thereto, said gate unit transmitting said read activation signal when said combining circuit output signal has said fourth logic state.

5. The memory unit of claim 4 wherein an output signal of said gate unit becomes said third logic state in response to timing control signal.

6. A method for executing a read-modify-write operation in a synchronous dynamic random access memory unit, said method comprising the steps of:

during a first system clock period, retrieving a first data group from said memory unit and transmitting said first data group to a central processing unit, during a second consecutive system clock period, modifying said data group in said central processing unit;

during said second consecutive system clock period, preventing said memory unit from performing a read operation; and during a third consecutive system clock period, storing said first data group in said memory unit.

7. The method of claim 6 wherein said preventing step includes the step of blocking a memory unit activation and thereby preventing a read or write operation during said modifying step.

8. The method of claim 6 further comprising the step of operating said memory unit in a page mode.

9. The method of claim 6 wherein said retrieving step includes the steps of:

retrieving a parity bit from said storage cell array associated with said retrieved data group;

generating a parity bit from said retrieved data group; and comparing said retrieved parity bit with said stored parity bit.

10. The method of claim 9 wherein said storing step includes the steps of:

generating a parity bit from said group of data bits to be stored in said memory unit; and storing said parity bit in a storage cell associated with the storage cells into which said data signals are to be stored.

11. A data processing system comprising:

central processing unit; and synchronous DRAM memory unit coupled to said central processing unit and exchanging data signals therewith, said central processing unit applying control and address signals to said memory unit, said memory unit including:

a storage cell array into which data signals to be transmitted to the central processor are read and into which data signals from the central processing unit are to be stored; and a control unit responsive to address and control signals and a system clock signal for activating selected storage cells and initiating read and write operations for said storage cell array, said control unit including a gate circuit responsive to said address signals, a storage cell read signal, and a system clock signal for preventing a read operation during a system clock cycle in which address signals from the next system clock cycle and said system clock cycle are identical.

12. The data processing system of claim 11 wherein said memory unit operating in a page mode.

13. The data processing system of claim 11 wherein said memory unit includes a parity generating and checking circuit.

14. The data processing system of claim 11 wherein said gate circuit has:

a gate unit for transmitting said read activation in response to a change signal; and a plurality of change circuits, each change circuit having an address signal applied thereto, wherein a change circuit generates a change signal when an applied address signal changes states.

* * * * *